US006903576B2

(12) United States Patent
Narwal

(10) Patent No.: US 6,903,576 B2
(45) Date of Patent: Jun. 7, 2005

(54) VOLTAGE LEVEL TRANSLATOR FOR TRANSLATING LOW TO HIGH VOLTAGE LEVELS IN DIGITAL INTEGRATED CIRCUITS

(75) Inventor: Rajesh Narwal, Karnal (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 74 days.

(21) Appl. No.: 10/675,923

(22) Filed: Sep. 29, 2003

(65) Prior Publication Data

US 2004/0124879 A1 Jul. 1, 2004

(30) Foreign Application Priority Data

Sep. 30, 2002 (IN) ..................................... 994/DEL/2002

(51) Int. Cl.[7] ......................................... H03K 19/0175
(52) U.S. Cl. .............................. 326/68; 326/75; 326/81; 327/333
(58) Field of Search .............................. 326/63, 68, 75, 326/80–83; 327/333

(56) References Cited

U.S. PATENT DOCUMENTS

| 5,422,523 A | 6/1995 | Roberts et al. |
| 6,781,413 B2 * | 8/2004 | Kihara et al. ................. 326/68 |

* cited by examiner

Primary Examiner—Anh Q. Tran
(74) Attorney, Agent, or Firm—Carol W. Burton, Esq.; William J. Kubida, Esq.; Hogan & Hartson L.L.P.

(57) ABSTRACT

An improved low voltage to high voltage translator for digital electronic circuits providing reduced rise times, fall times and transition times that remain independent of operating conditions. This is accomplished by modifying a conventional low-to-high voltage translator to include a switched active pull-up at the output of the first high-voltage switch, controlled by the input low-voltage signal and gated by the output from the low-to-high-voltage translator and a switched active pull-down at the output of the first high-voltage switch, controlled by the input low-voltage signal and gated by the complement of the output from the low-to-high-voltage translator, so as at to provide regenerative pull-up and pull-down that also counteracts the bootstrap capacitance at the output of the first high-voltage switch.

10 Claims, 7 Drawing Sheets

VOLTAGE LEVEL TRANSLATOR FOR TRANSLATING LOW TO HIGH VOLTAGE LEVELS IN DIGITAL INTEGRATED CIRCUITS

FIELD OF THE INVENTION

This invention relates to voltage level translators for translating low to high voltage levels in digital intergrated circuits. This invention further relates to a method for translating high voltage levels in digital intergrated circuits.

BACKGROUND OF THE INVENTION

Advances in semiconductor fabrication and manufacturing techniques have led to smaller, denser and more complex integrated circuits. Digital integrated circuits are spearheading the drive to increased densities and smaller geometries. At the same time digital integrated circuits are also being operated at higher speeds. The combination of increased density and higher speeds also results in increased power dissipation, which in turn increases the temperature of the device thereby reducing its reliability. Inorder to counteract the increased power dissipation modern devices are increasingly being designed to operate at reduced voltage levels. Current technology supports digital integrated circuits based on transistors with gate lengths reduced to 0.12u with corresponding supply voltages as low as 1.2V. However the IO requirements of digital integrated circuits are defined by the requirements of external devices and hence remain at voltage levels that are significantly higher than the core circuitry. Typical IO voltages remain at a 3.3 V to 5.0V level while the core circuitry operates at 1.2V. To operate in such an environment it is necessary to use voltage level translators, which translate signals at the lower voltage level of core logic to the higher lower voltage levels of the IO.

A transistor operating at a higher voltage such as 3.3V is designed to have a relatively long gate length to avoid punchthrough. At the same time, the transistor must also have a thicker gate oxide to prevent oxide break down. These transistors are relatively high voltage devices and are termed as 3.3V devices. If a 3.3V device is used for operation at lower voltage levels such as 1.2V, it provides relatively poor performance in term of speed owing to higher channel resistance and higher gate capacitance. In contrast, transistors operating at lower voltage levels are designed with shorter channel lengths to reduce the channel resistance and gate capacitance as the breakdown voltage requirements are lower. The lower resistance and gate capacitance enable significant increase in speed of operation besides providing higher density. Transistors which are used for lower voltages are low voltage devices and if designed for 1.2V operation are termed as 1.2V devices in the context of this document. Low voltage transistor models are not designed for use with higher voltages because of the risk of punchthrough and gate oxide breakdown.

To exploit the advantages of low voltage core logic and to make it compatible with the high voltage IO interface it is necessary to use a voltage level translator. While there are many techniques used to realize voltage level translators almost all of them produce voltage level translators that do not achieve equal rise and fall time under varying operating conditions resulting in the generation of unwanted glitches and delays.

Modern FPGAs utilize core voltages as low as 1.2 volts while IO voltage remains at 3.3 volts. Signals from the 1.2 volt core, if fed directly to circuitry working at higher voltage 3.3 volts will result in unnecessary power dissipation, since the 1.2 volt signal from the core logic will always keep the IO logic's PMOS transistor ON as its source is connected to 3.3 volts. To overcome this problem it is necessary to incorporate voltage translator circuitry that converts the 1.2 volts signal to 3.3 volts signal without any static power dissipation.

FIG. 1 shows a voltage translator according to the prior art as disclosed in U.S. Pat. No. 5,422,523. In this patent the low voltage input IN is fed to the gate of NMOS transistor 104 and also to the gate of a second NMOS transistor 103 through inverter LV. Inverter LV operates at a low voltage (VDDL). Transistors 103 and 104 are biased through transistors 101 and 102. The gate of transistor 102 is connected to the output OUT 1, while the gate of transistor 101 is connected to node 206. When IN rises from 0 volts to VDDL, NMOS transistor 104 is turned-on which reduces the voltage at node 206. This voltage reduction turns-on PMOS transistor 101 and increases the voltage at OUT 1. The output of LV at this time is 0 volts which turns-off NMOS transistor 103. The increase in voltage at OUT 1 reduces the conduction level of PMOS transistor 102 which further decreases the voltage at 206. This cycle is repeated until the voltage at OUT 1 rises to VDDH.

Similarly, when IN falls from VDDL to 0 volts, NMOS transistor 104 turns-off and NMOS transistor 103 turns-on, pulling down OUT 1 The reduction in voltage at OUT 1 turns-on PMOS transistor 102 slightly which in turn increases the voltage at node 206. This condition decreases the conductivity of PMOS transistor 101 leading to further reduction in the voltage at OUT 1. This recursive feedback ultimately reduces the voltage at OUT 1 to 0 volts.

The drawback with this approach is that it is difficult to achieve equal rise fall times under different operating conditions. This difficulty arises from unwanted capacitance effects which become more prominent at low voltages such as 1.2 volts. Also, since the difference between 1.2 volts and 3.3 volts is large the variations of various parameters with operating conditions has a pronounced effect on circuit performance.

SUMMARY OF THE INVENTION

An object of the invention is to provide a method and device to reliably interface the signals from the core logic to the 10 pads when these operate at different voltages. Another object of the invention is to provide a voltage translator circuit which achieves equal delays and rise fall time under different operation conditions. It is yet another object of the invention to overcome the disadvantages arising from the bootstrapping of the IO stages.

To achieve these and other objectives this invention provides an improved low voltage to high voltage translator for digital electronic circuits providing reduced rise times, fall times and transition times that remain independent of operating conditions. This is accomplished by modifying a conventional low-to-high voltage translator comprising a first high-voltage switch driven by the input low-voltage signal, a second high-voltage switch driven by the complement of the input low-voltage signal,the output of the first high-voltage switch enabling an active switched load connected to the output of the second high-voltage switch when the first high-voltage switch is OFF and disabling it when the first high-voltage switch is ON, the output of the second high-voltage switch enabling an active switched load connected to the output of the first high-voltage switch when the second high-voltage switch is OFF and disabling it when the second high-voltage switch is ON, the output from the low-to-high voltage translator being provided by the output from the second high-voltage switch to include a switched active pull-up at the output of the first high-voltage switch, controlled by the input low-voltage signal and gated by the output from the low-to-high-voltage translator and a switched active pull-down at the output of the first high-voltage switch, controlled by the input low-voltage signal and gated by the complement of the output from the low-to-high-voltage translator, so as at to provide regenerative pull-up and pull-down that also counteracts the bootstrap capacitance at the output of the first high-voltage switch.

DETAILED DESCRIPTION

Figure 2:
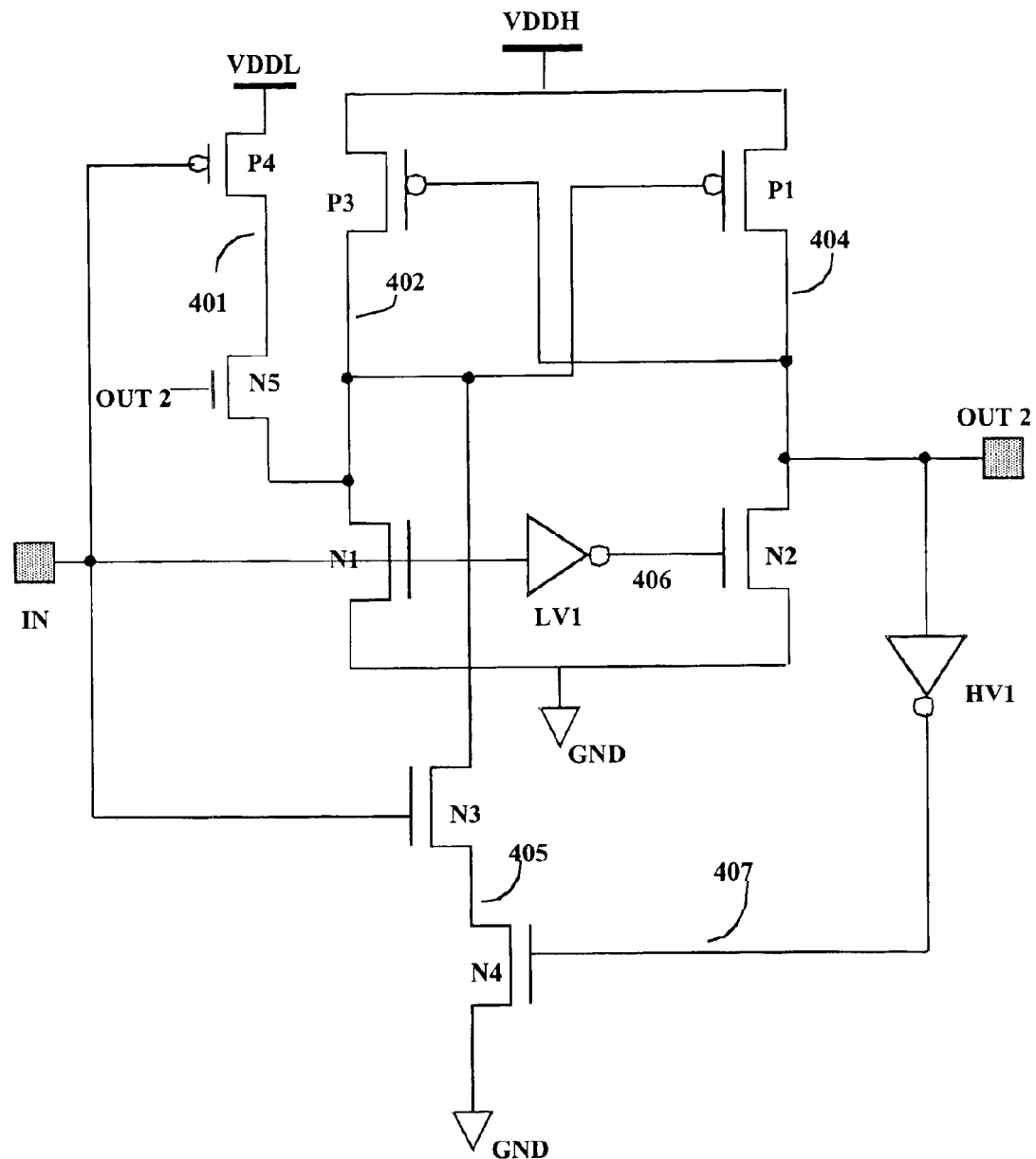
FIG. 2 shows the schematic of a voltage translator in accordance with the present invention.

The invention will now be described in accordance with the accompanying drawings. FIG. 2 shows a preferred embodiment of the invention. The input IN from the core logic is connected to the gates of transistors N1, P4, N3 and to the gate of NMOS transistor N2 through inverter LV1. Inverter LV1 is an inverter driven by low voltage. The source of PMOS transistor P4 is connected to low voltage source (VDDL), and the drain is connected to NMOS transistor N5. The gate of transistor N5 is connected to the output OUT 2, and the second conducting terminal is connected to line 402. Voltage source VDDH is connected to the source of PMOS transistors P1 and P3. The gates of the PMOS transistors P1 and P3 are cross coupled to drains 402, 404 (OUT 2) of the NMOS transistors respectively.

The source of NMOS transistor N1 is connected to GND and its drain is connected to line 402. The gate of transistor N2 is connected to the output of LV1. The source and drain of N2 are connected to GND and OUT 2 respectively while the conducting terminals of NMOS transistor N3 are connected to lines 402 and 405. The source of NMOS transistor N4 is connected to GND and its drain is connected to line 405. The gate of transistor N4 is connected to the output of inverter HV1 through line 407. OUT2 is connected to the input of inverter HV1 while the gate of MOS transistor N5 is connected to OUT 2.

When input IN is at High voltage (e.g. 1.2 V), PMOS transistor P4 is OFF and NMOS transistor N1 is conducting pulling line 402 to GND. This makes PMOS transistor P1 ON. The LOW output of LV1 turns-off NMOS transistor N2. The conduction of PMOS transistor P1 causes node OUT 2 to go High. The High voltage (e.g. 3.3V) at OUT 2 causes inverter HV1 to make line 407 low thereby turning OFF NMOS transistor N4 while at the same time turning OFF PMOS transistor P3 and keeping NMOS transistor N5 conducting.

When the input IN goes from high (1.2V) to low (0V) voltage the gate of NMOS transistor N1 goes from high to low. The bootstrap capacitance at line 402 takes voltage at this net below 0 volts which delays the process of making P1 OFF. If slow models are used this delay is increased drastically. P4 and N5 are used to overcome this problem. The gate of N5 is connected to OUT 2 which is high voltage (3.3V), this keeps N5 ON. As soon as IN goes from high to low, the MOS transistor P4 becomes ON. Because of bootstrapping N1 tries to take line 402 below 0 volts but the combination of P4 and N5 opposes this effect and minimizes the bootstrapping effect. The circuitry tries to balance operation under all operating conditions. LV1 makes line 406 high voltage (1.2V) which makes NMOS transistor N2 ON. This reduces voltage at OUT 2. Reduction in voltage at OUT 2 makes PMOS transistor P3 ON. This further increases the voltage at line 402 thereby making PMOS transistor P1 conduct less thereby reducing voltage at OUT 2. As a result, PMOS transistor P3 turns ON harder and this positive feedback ultimately makes OUT 2 0 volts. As OUT 2 becomes 0 volts PMOS transistor P1 turns fully OFF and PMOS transistor P3 turns fully ON. As soon as the falling voltage at OUT 2 crosses the trip point level of inverter HV1 line 407 becomes high (3.3V) turning NMOS transistor N4 ON. NMOS transistor N3 is OFF since its gate is connected to IN which is 0 volts. In the final stable condition when IN and OUT 2 both are 0 volts there is no conduction path between VDDH and GND or between VDDL and GND. Thus there is no static power dissipation in the circuit.

Similarly, when input IN makes a transition from low voltage to High voltage e.g. 0 volts to 1.2 volts the circuit acts to make P1 ON as early as possible so that output OUT 2 reaches VDDH volts quickly. When both IN and OUT 2 are at 0V NMOS transistor N5 is OFF and NMOS transistor N4 is ON. As IN increases from 0 volts to 1.2 volts NMOS transistor N1 and NMOS transistor N3 start conducting. Since OUT 2 is still 0 volts inverter HV1 keeps NMOS transistor N4 ON. The combination of NMOS transistors N3, N4 and N1 pulls down line 402 to 0 volts faster then the case when there is only N1 to pull it down. Inverter LV1 acts to make N2 OFF. With P1 beginning to conduct the voltage at OUT 2 starts increasing and as OUT 2 reaches the trip point of HV1 the voltage at line 407 reaches 0 volts. This makes NMOS transistor N4 OFF. The trip point of HV1 is adjusted according to the amount of time for which NMOS transistor N4 is to be kept ON. As OUT 2 starts increasing PMOS transistor P3 starts turning OFF. This will further reduce the voltage at line 402 and ultimately this feedback will take node OUT 2 to 3.3 volts. This makes PMOS transistor P3 turn OFF and line 402 becomes 0 volts. In the final stable condition when IN is 1.2 volts and OUT 2 is 3.3 volts there is no conduction path between VDDH and GND or between VDDL and GND. Thus there is no static power dissipation in the circuit.

The circuit of this invention compensates for the effect of bootstrapping capacitance and also improves transition times. Low to high transitions are improved by incorporating N3 and N4. N4 remains ON for a very short time just to make P1 ON with greater power than if only N1 pulls line 402 down. Thus N3 and N4 act only to improve the initial voltage fall at line 402. Similarly high to low transitions are improved by compensating effects of bootstrapping capacitance. The circuit also works well for converting 3.3V to 5V.

Figure 3A:
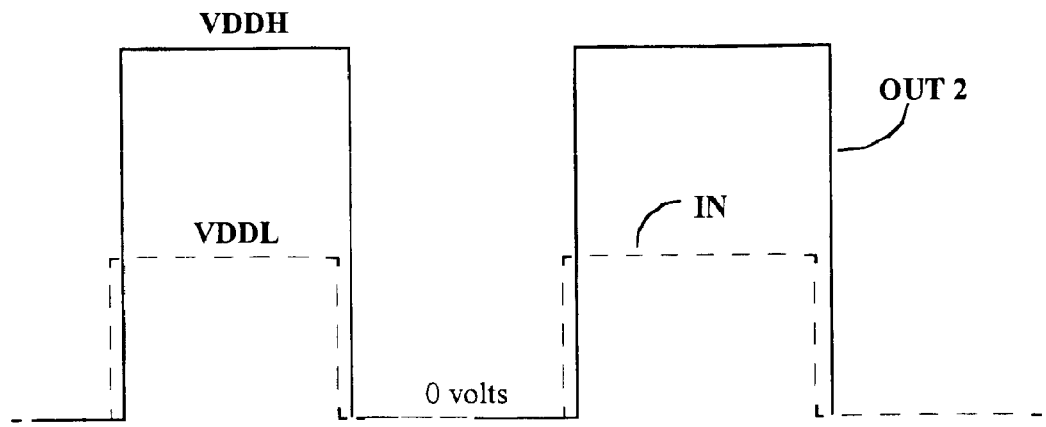
FIG. 3a shows the voltage waveforms of proposed voltage translator.

FIG. 3a shows voltage waveforms at nodes IN and OUT2 for proposed voltage level translator. The dotted line waveform shows the input waveform at IN, while the solid line shows output voltage at node OUT2.

Figure 3B:
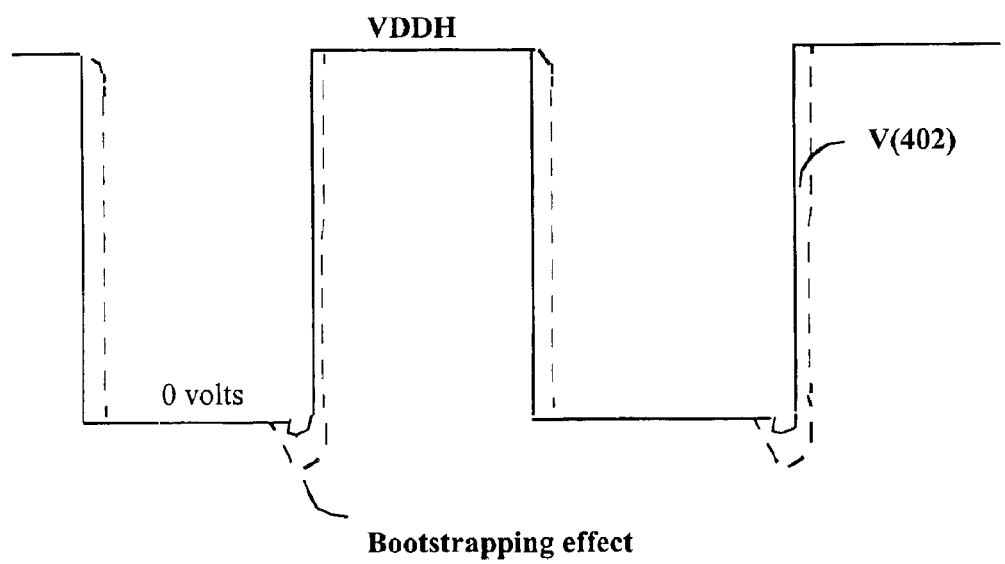
FIG. 3b shows the comparitive bootstraping effect in the prior art and present invention.

FIG. 3b shows the voltage waveform at line 402 for an improved voltage level translator according to this invention. The solid line shows voltage at 402 while the dotted line is the waveform at line 402 without using the MOS transistors N3, N4, N5 and P4. The effect of the bootstrap capacitor is clearly visible by seeing dotted waveform when voltage at line 402 starts rising. When Input IN falls, the voltage at line 402 should rise but because of bootstrapping capacitance the voltage goes below 0 volts. This effect is reduced to a large extent as shown by the solid line waveform. Similarly when IN goes from 0 volts to 1.2 volts because of the MOS transistors N3 and N4 the initial rate of fall at line 402 becomes faster as shown by the solid line waveform.

Figure 1:
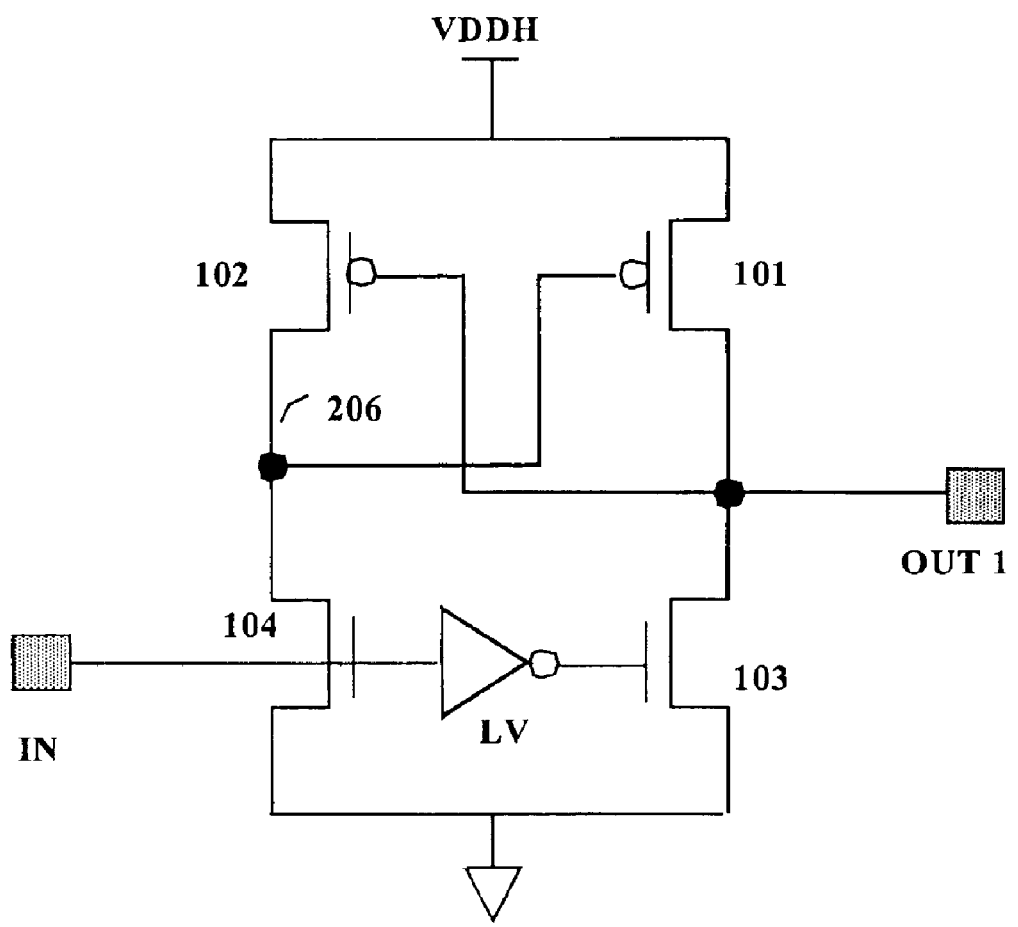
FIG. 1 shows a voltage translator according to the prior art.
Figure 4:
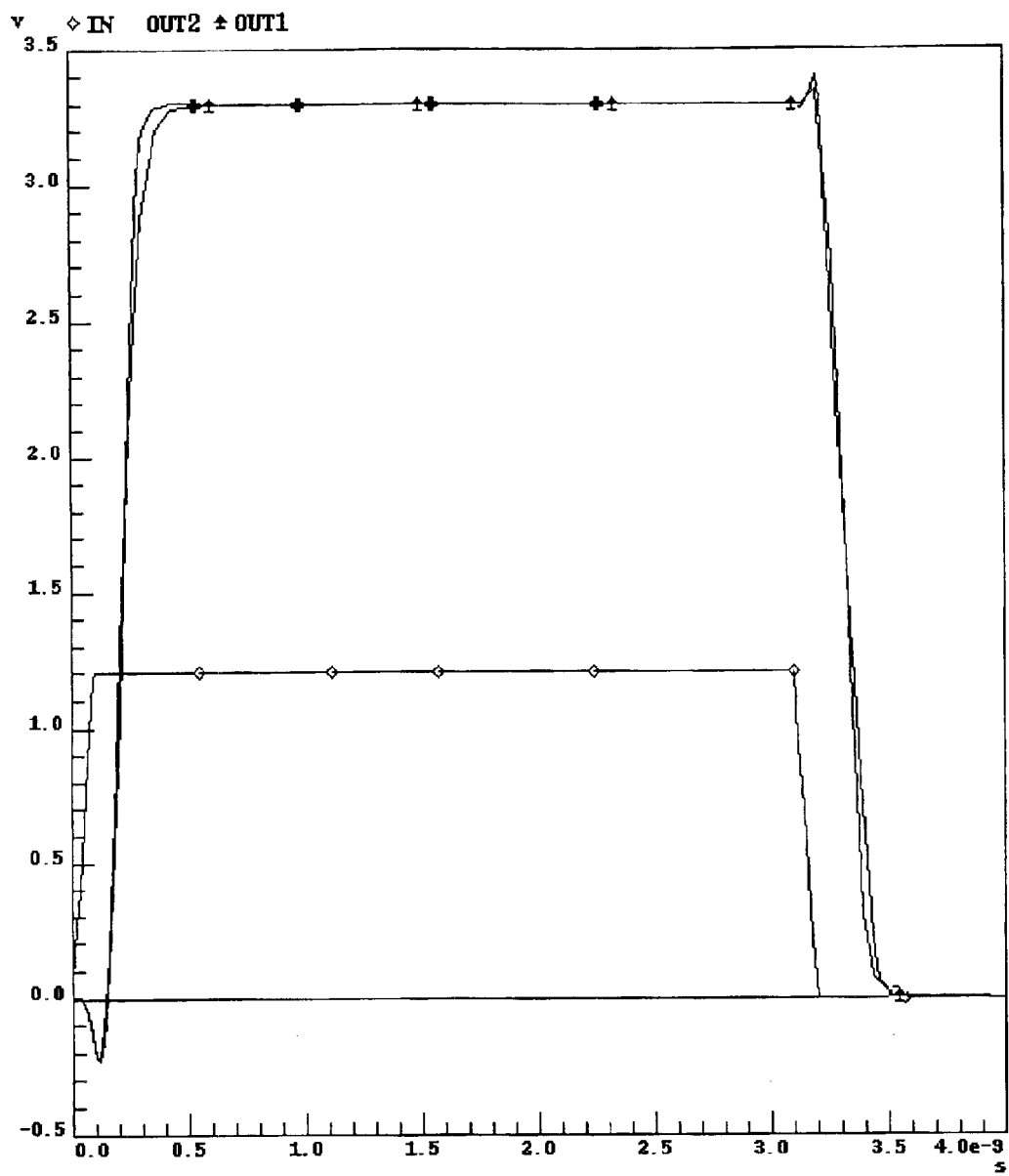
FIG. 4 shows the simulation waveforms of the prior art circuit as well as the proposed circuit for typical models.

FIG. 4 shows simulation waveforms of the prior art circuit shown in FIG. 1 and the proposed circuit shown in FIG. 2 along with the input IN. OUT1 and OUT2 are the voltages at the output node of the prior art and proposed circuits respectively under typical operating conditions. The two waveforms are superimposed and the rise and fall delays are almost the same.

Figure 5:
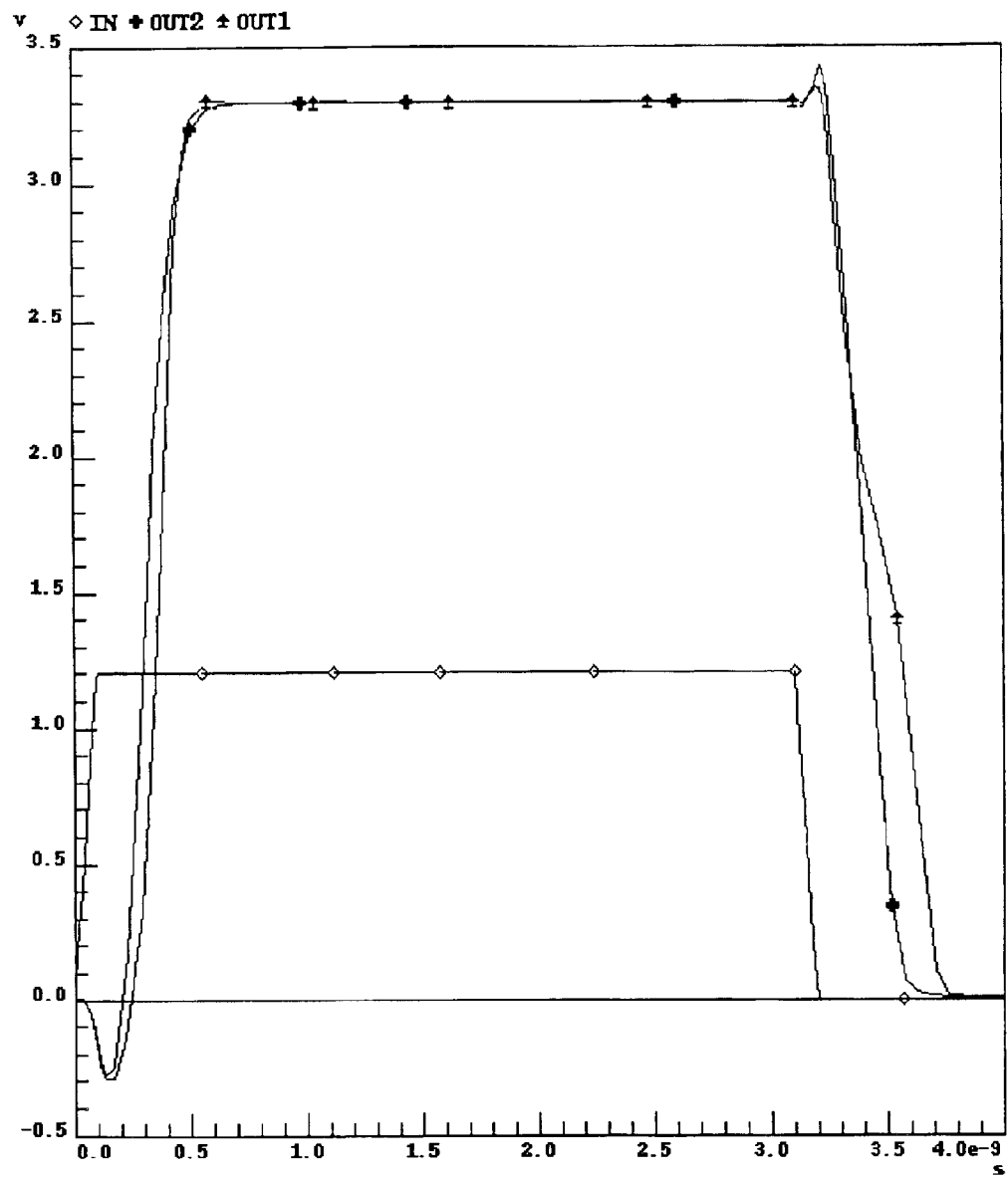
FIG. 5 shows the variation in the simulation waveforms using slow models.

FIG. 5 shows the simulation results when models are changed from typical to slow. The proposed circuit output OUT2 shows better rise and fall delays and transition times.

Figure 6:
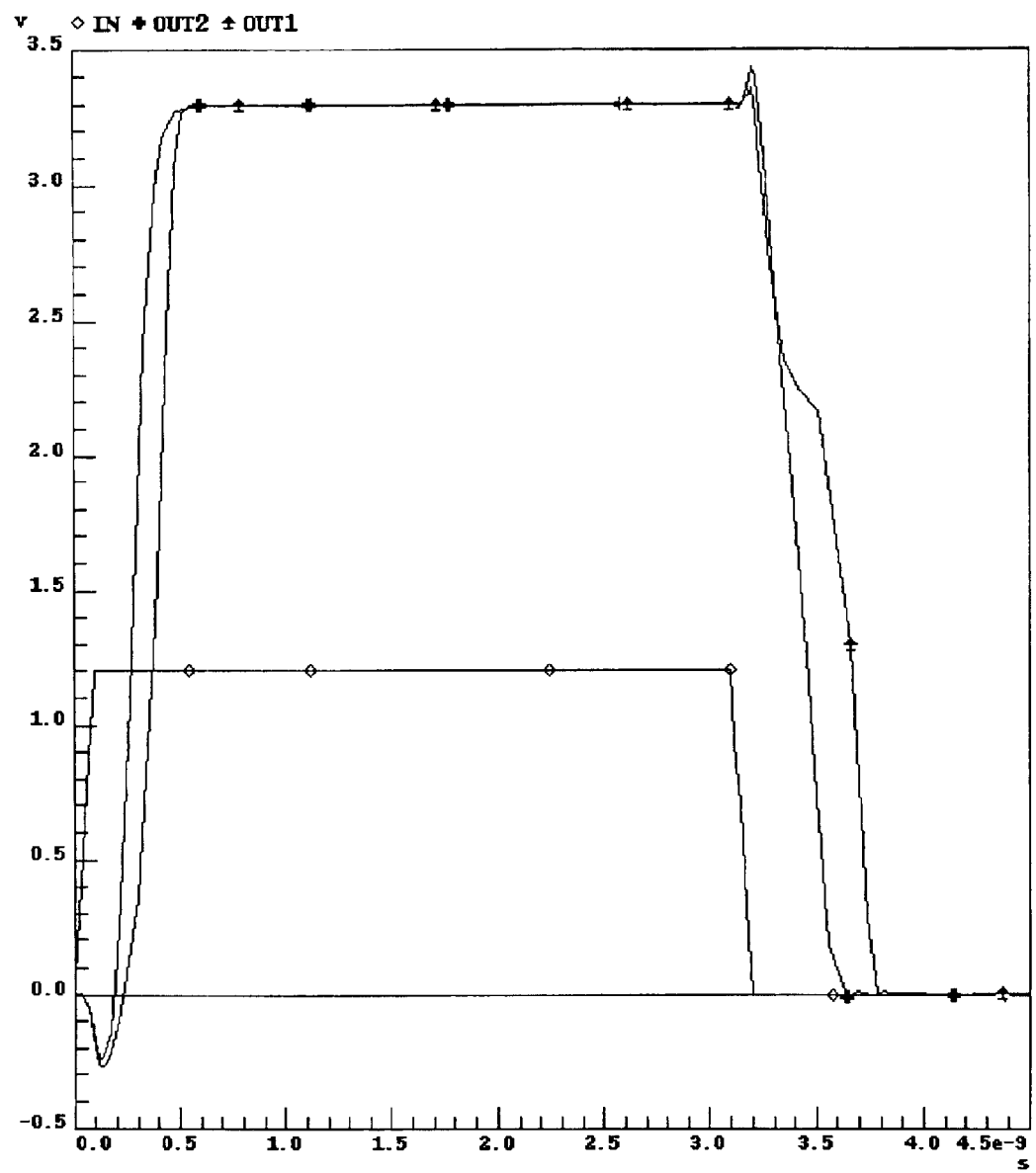
FIG. 6 shows the variation in the simulation waveforms using slowfast models (i.e., NMOS is slow and PMOS is fast).

FIG. 6 shows the simulation results when models are changed from typical to slowfast i.e NMOS is slow and PMOS is fast. The proposed circuit output OUT2 shows better rise and fall delays and transition times. NET 206 shows the voltage variation at 206 for the prior art circuit of FIG. 1 whereas NET 402 shows the waveform at 402 in the improved circuit of FIG. 2.

Figure 7:
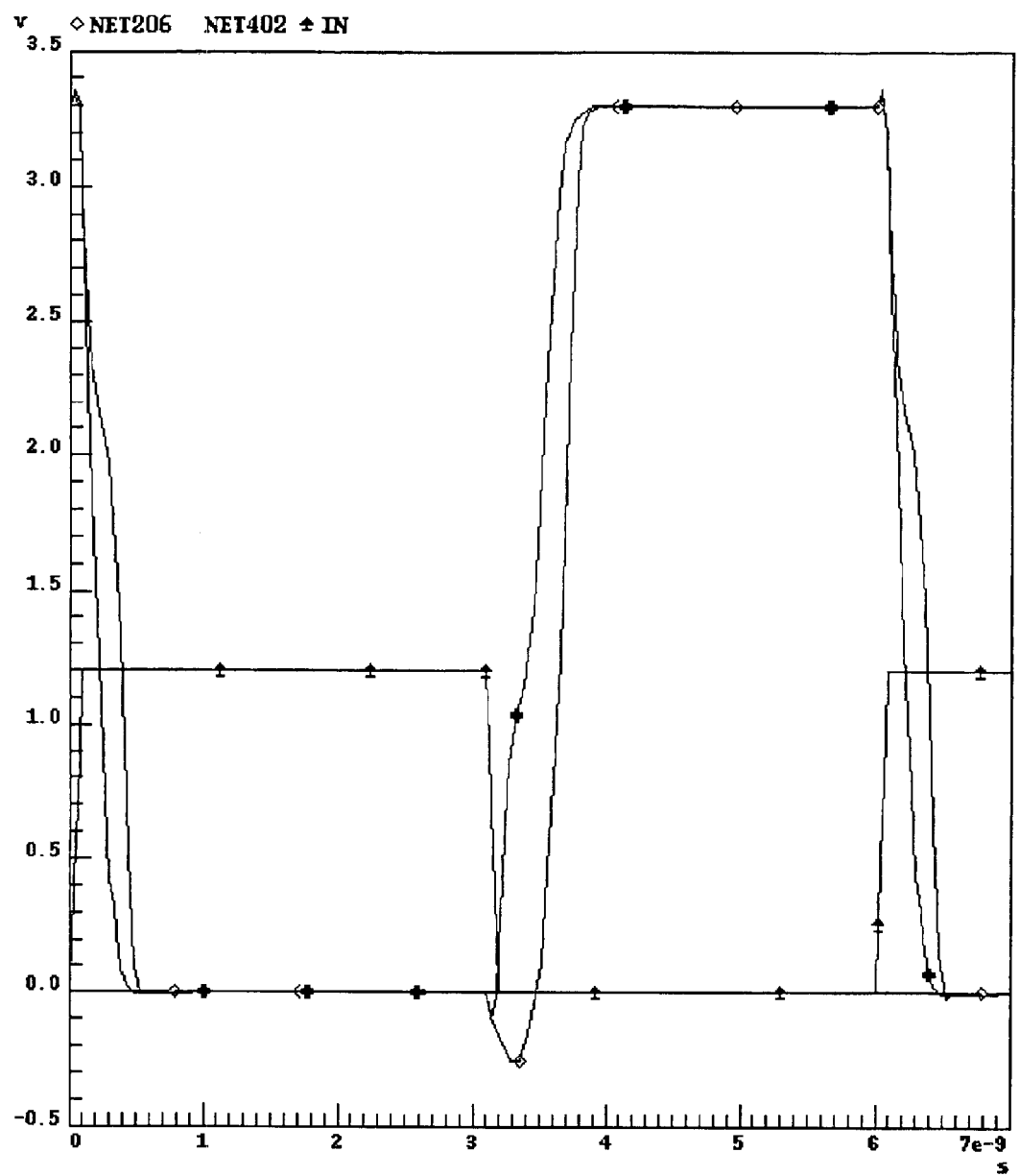
FIG. 7 shows the comparison of waveforms showing the effect of bootstrap capacitance.

FIG. 7 shows the simulation waveforms at nets 402 and 206 under slowfast models. The waveform clearly shows the reduction in bootstrap effect because of inclusion of NMOS transistors N3 and N4.

While the foregoing description related to an application comprising 1.2V and 3.3V circuitry, the invention is by no means limited to these operating voltage levels. As any with ordinary skill in the art will realize, the principals employed will work equally well in applications involving other voltage levels. Accordingly, the invention is by no means limited by the foregoing examples but is bounded only by the scope of the claims.

That which is claimed is:

1. An improved voltage translator for digital electronic circuits providing reduced rise times, fall times and transition times that remain independent of operating conditions, comprising:

a first high-voltage switch driven by the input low-voltage signal;

a second high-voltage switch driven by the complement of the input low-voltage signal, in which (a) the output of the first high-voltage switch enabling an active switched load connected to the output of the second high-voltage switch when the first high-voltage switch is OFF and disabling it when the first high-voltage switch is ON, (b) the output of the second high-voltage switch enabling an active switched load connected to the output of the first high-voltage switch when the second high-voltage switch is OFF and disabling it when the second high-voltage switch is ON, and (c) the output from the low-to-high voltage translator being provided by the output from the second high-voltage switch;

a switched active pull-up at the output of the first high-voltage switch, controlled by the input low-voltage signal and gated by the output from the low-to-high-voltage translator; and a switched active pull-down at the output of the first high-voltage switch, controlled by the input low-voltage signal and gated by the complement of the output from the low-to-high-voltage translator, so at to provide regenerative pull-up and pull-down that also counteracts the bootstrap capacitance at the output of the first high-voltage switch.

2. A method for providing voltage translation for digital electronic circuits enabling reduced rise times, fall times and transition times that remain independent of operating conditions, comprising the steps of:

providing a first high-voltage switch driven by the input low-voltage signal;

providing a second high-voltage switch driven by the complement of the input low-voltage signal;

causing the output of the first high-voltage switch to enable an active switched load connected to the output of the second high-voltage switch when the first high-voltage switch is OFF and disable it when the first high-voltage switch is ON;

causing the output of the second high-voltage switch to enable an active switched load connected to the output of the first high-voltage switch when the second high-voltage switch is OFF and disable it when the second high-voltage switch is ON;

providing the output from the low-to-high voltage translator from the output from the second high-voltage switch; and providing a switched active pull-up at the output of the first high-voltage switch, controlled by the input low-voltage signal and gated by the output from the low-to-high-voltage translator and a switched active pull-down at the output of the first high-voltage switch, controlled by the input low-voltage signal and gated by the complement of the output from the low-to-high-voltage translator, so as to provide regenerative pull-up and pull-down that also counteracts the bootstrap capacitance at the output of the first high-voltage switch.

3. A voltage translator circuit comprising:

a first circuit portion including a load coupled to a high voltage power supply, an intermediate node, and an output;

a second circuit portion including bias circuitry coupled to the intermediate node, the output, and ground;

a third circuit portion including a switch coupled to a low voltage power supply, an input, the output, and the intermediate node; and a fourth circuit portion including a switch coupled to the input, the intermediate node, the output, and ground.

4. A voltage translator circuit as in claim 3 in which the first circuit portion comprises a pair of cross-coupled PMOS transistors.

5. A voltage translator circuit as in 3 in which the second circuit portion comprises a pair of NMOS transistors.

6. A voltage translator circuit as in claim 3 in which the second circuit portion comprises a pair of NMOS transistors.

7. A voltage translator circuit as in claim 3 in which the second circuit portion comprises a pair of NMOS transistors having gates coupled through an inverter.

8. A voltage translator circuit as in 3 in which the third circuit portion comprises a PMOS transistor and an NMOS transistor.

9. A voltage translator circuit as in claim 3 in which the third circuit portion comprises a serially-coupled PMOS transistor and an NMOS transistor.

10. A voltage translator circuit as in claim 3 in which the fourth circuit portion comprises first and second serially-coupled NMOS transistors, wherein the gate of the second NMOS transistor is coupled to the output via an inverter.

* * * * *